(12) United States Patent
Richards

(10) Patent No.: US 9,255,704 B1
(45) Date of Patent: Feb. 9, 2016

(54) STREETLIGHT COOLING SYSTEM

(71) Applicant: James L. Richards, Broomfield, CO (US)

(72) Inventor: James L. Richards, Broomfield, CO (US)

( * ) Notice: Subject to any disclaimer, the term of this patent is extended or adjusted under 35 U.S.C. 154(b) by 143 days.

(21) Appl. No.: 14/205,113

(22) Filed: Mar. 11, 2014

Related U.S. Application Data

(60) Provisional application No. 61/777,100, filed on Mar. 12, 2013.

(51) Int. Cl.
*F21V 29/00* (2015.01)
*H01L 33/64* (2010.01)
*F21V 29/56* (2015.01)

(52) U.S. Cl.
CPC .............. *F21V 29/248* (2013.01); *F21V 29/30* (2013.01); *H01L 33/648* (2013.01); *F21V 29/006* (2013.01); *F21V 29/56* (2015.01)

(58) Field of Classification Search
CPC ....... F21V 29/20; F21V 29/30; F21V 29/006; F21V 29/51; F21V 29/56; F21V 29/57; F21V 29/83; F21V 29/248; H01L 33/648
See application file for complete search history.

(56) References Cited

U.S. PATENT DOCUMENTS

| | | | | |
|---|---|---|---|---|
| 6,917,143 B2* | 7/2005 | Matsui | ...................... | F21K 9/00 257/E25.02 |
| 7,309,145 B2* | 12/2007 | Nagata | .................... | F21V 29/30 257/714 |
| 8,092,050 B2* | 1/2012 | Hou | ...................... | F21V 29/004 362/218 |
| 8,152,341 B2* | 4/2012 | Wheelock | ................. | F21K 9/13 362/249.02 |
| 8,247,956 B2* | 8/2012 | Liu | ........................ | F21V 29/004 313/34 |
| 8,262,263 B2* | 9/2012 | Dinh | ........................ | F21K 9/00 165/104.21 |
| 2009/0059594 A1* | 3/2009 | Lin | ........................... | F21K 9/00 362/294 |
| 2011/0133623 A1* | 6/2011 | Tsai | ....................... | F21V 29/30 313/46 |

* cited by examiner

*Primary Examiner* — Alan Cariaso
(74) *Attorney, Agent, or Firm* — Novak Druce Connolly Bove + Quigg LLP

(57) ABSTRACT

A streetlight includes a light-emitting diode and a passive cooling system. The light-emitting diode is in thermal engagement with the bottom of the cooling system. The cooling system has an upper cooling chamber and a lower cooling chamber displaced from the upper cooling chamber. A thermal flow circuit extends through a domed chamber, the upper cooling chamber, a return passage and the lower cooling chamber. The domed chamber is inside the lower cooling chamber in thermal engagement with the bottom directly over the light-emitting diode and has inlet channels in thermal engagement with the bottom and an outlet to the upper cooling chamber.

4 Claims, 3 Drawing Sheets

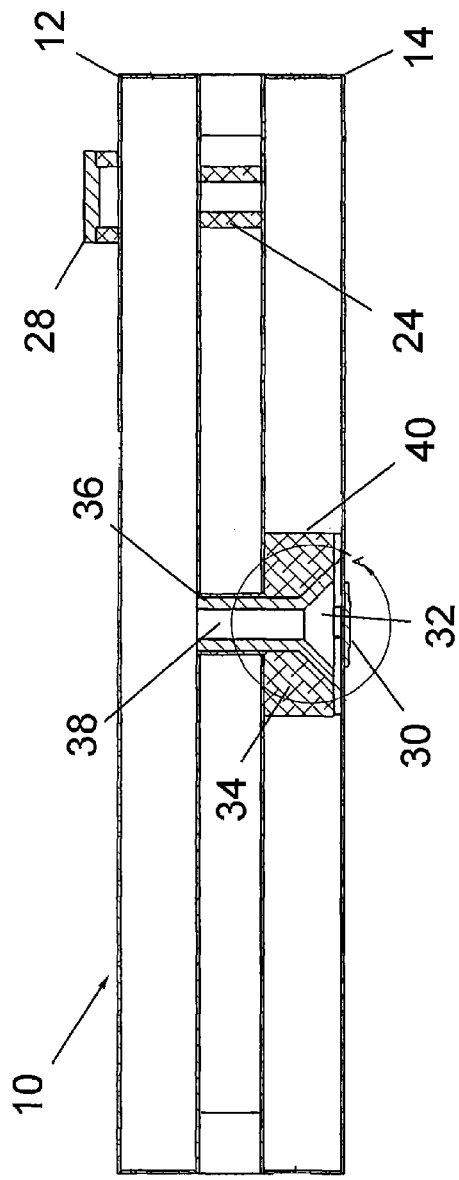
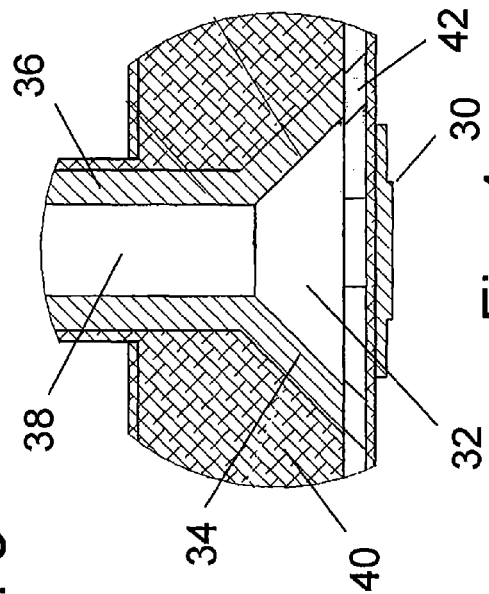
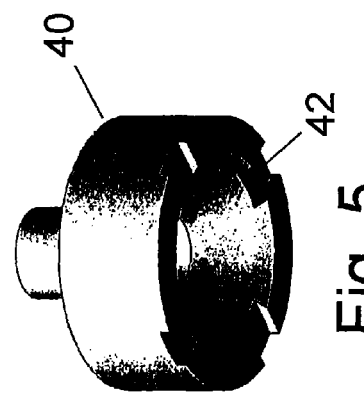
Fig. 3
Fig. 4
Fig. 5

STREETLIGHT COOLING SYSTEM

RELATED APPLICATION

This a utility application claiming priority to U.S. Provisional Application 61/777,100, filed Mar. 12, 2013, the disclosure of which is incorporated in its entirety herein by reference.

BACKGROUND OF THE INVENTION

The field of the present invention is passive cooling systems for streetlights.

With the advent of light-emitting diodes (LEDs), active maintenance of the temperature of these light sources has been needed to keep them below 150° F. Such devices commercially available for streetlights use fans or other powered devices.

SUMMARY OF THE INVENTION

The present invention is directed to a streetlight having a light-emitting diode light source and a cooling system. A domed chamber is defined by a thermally conductive base, a thermally insulative wall, an apex, an outlet at the apex and inlets positioned about the periphery of the thermally insulative wall at the base. The inlets are in communication with the chamber. The thermally conductive base is in thermal communication with the light source. A thermally insulative flue extends from the outlet. A liquid to air heat exchanger is in communication with the flue and the inlets to induce convection of a liquid through the chamber, flue and heat exchanger. The system is passive as no power is required to run the cooling system other than the heat of the light source generated during operation of the streetlamp.

Thus, a principal object of the present invention is to provide an LED streetlamp not requiring a power driven cooling system. Other objects and advantages will appear hereinafter.

BRIEF DESCRIPTION OF THE DRAWINGS

FIG. 3 is a cross-sectional view of the system of FIG. 1.

FIG. 4 is a detail cross-sectional view taken from FIG. 3.

FIG. 5 is a perspective view of the thermally insulative wall of the system of FIG. 1.

DETAILED DESCRIPTION OF THE PREFERRED EMBODIMENTS

The description, drawings and claims employ terms such as upper, lower and bottom and images which reflect the orientation of the cooling system needed to drive passive liquid circulation.

A passive, self operating cooling system embodying the present invention with no moving parts cooled an LED for a streetlamp that needs to be kept below 150° F. The LED light operated at 85 watts of power. The ambient temperature during the operation was 65° F. The light heated the water to 87° F. after circulating through the system for 72 hours straight. The water temperature returning to thermal contact with the light was at the ambient 65° F. and the LED for a streetlamp was kept below 150° F.

Figure 2:
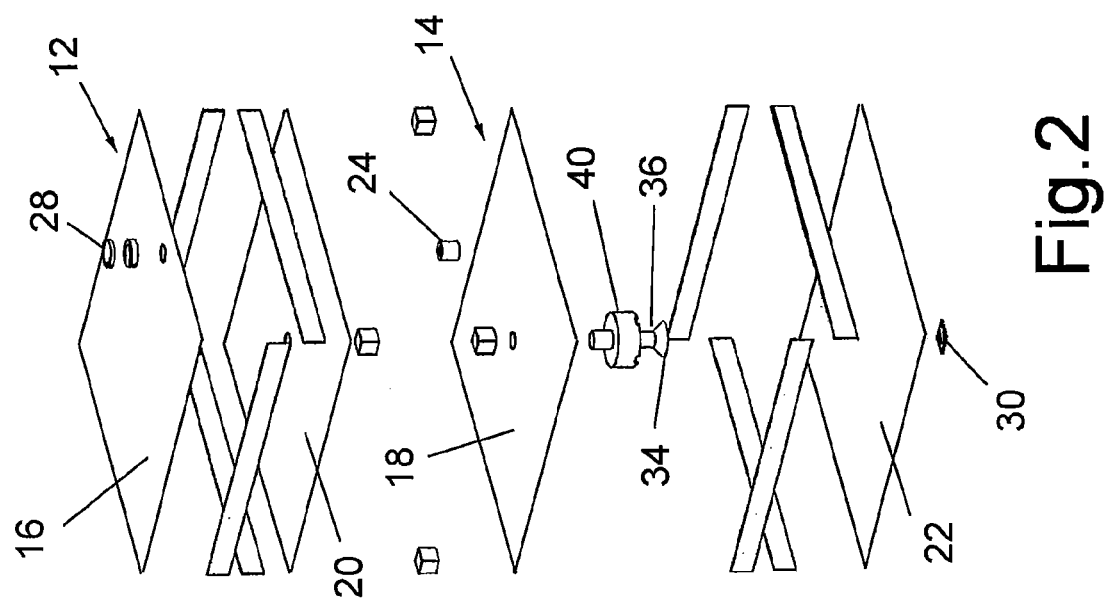
FIG. 2 is a exploded assembly perspective view of the system of FIG. 1.
Figure 1:
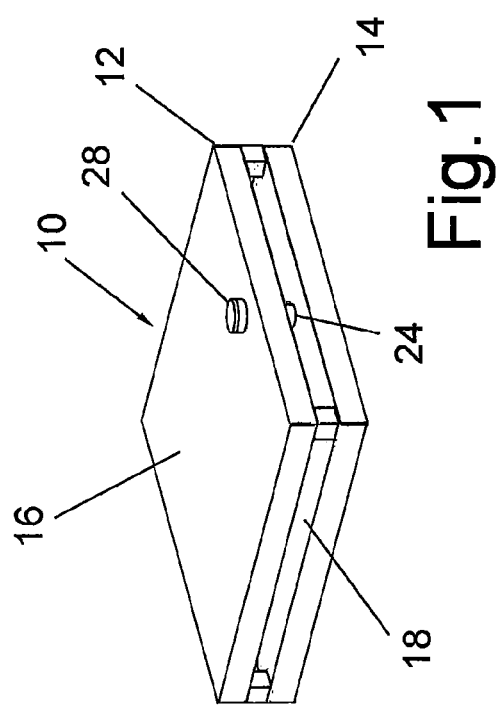
FIG. 1 is a perspective view of a cooling system for streetlamps.
Figure 6:
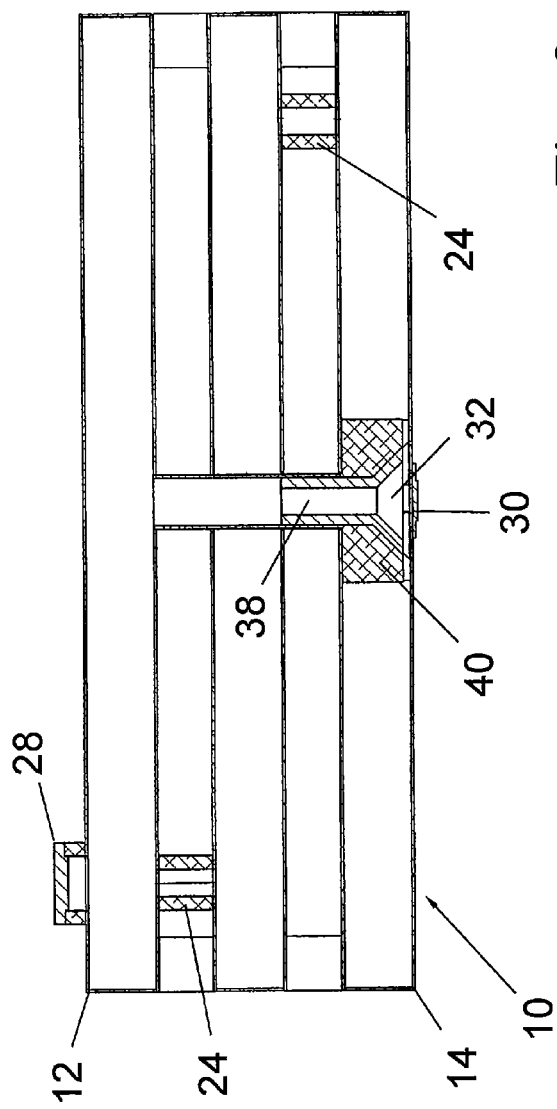
FIG. 6 is a cross-sectional schematic view of the system of FIG. 6.
Figure 7:
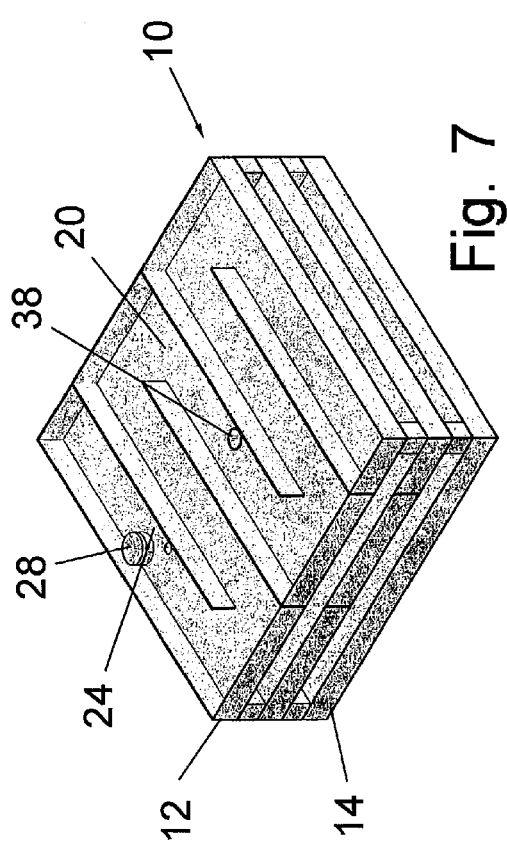
FIG. 7 is a perspective view of a third embodiment of a cooling system for streetlamps with the top plate removed to show baffles.

A liquid to air heat exchanger 10 includes two boxes 12, 14 which are eighteen inches square and one and a quarter inches deep with tops 16, 18 and bottoms 20, 22 out of 0.050 aluminum sheet in the preferred embodiment, which sheet is highly heat conductive. The upper box 12 defines an upper chamber and the lower box 14 defines a lower chamber. The two boxes 12, 14 are attached together at the four corners to make them a single unit assembly. The space between the boxes 12, 14 preferably have sufficient clearance to allow heat to radiate into the atmosphere and not to the other box. The upper box 12 has a single return passage 24 in one of the corners that goes back to the lower box 14 so there is a complete path for circulation to take place. Any number of boxes 12, 14 can be added to achieve the required cooling capability. Baffles 26 can be positioned in the boxes to create a labyrinth for the fluid to flow around to help heat transfer efficiency if needed. See FIG. 7. A coolant filler 28 is located on the top side of the top box 12 to fill the system with a liquid coolant such as water.

An LED light source 30 of 85 watts of power is fastened to the center of the bottom 22 of the lowest box 14. It is advantageous to have the LED light source 30 as thermally connected to the bottom 22 as possible. A domed chamber 32 is located on the opposite side of the lowest aluminum sheet 22 from the LED light source 30.

The domed chamber 32 is defined by a truncated conical dome 34 with a cylindrical tube 36 acting as a flue and extending from the truncation with a central passageway 38 therethrough. The dome 34 and tube 36 are insulated with encapsulating insulation material 40 to prevent heat transfer. The insulation material 40 is shown in the figures to be thick about the dome 34 and thinner up the tube.

There are four 0.5 inch wide slots 42 cut 0.003 inch tall as inlets about the base surface of the dome 34 and the insulation material 40. The inside base dimensions of the dome are just slightly larger in plan than the LED light source 30 mounted on the opposite side. The 0.003 inch tall slots 42 are equiangularly positioned circularly around the center of the LED light source 30 on the other side of the aluminum sheet 22. The slots 42 are designed to cause the fluid to move at a sufficient speed across the aluminum surface to absorb the heat energy right off the sheets surface and then rise up as the four fluid paths merge into each other as the fluid molecules become lighter with heat energy as compared to the new fluid just coming in. The insulated dome 34 prevents the heated fluid from prematurely releasing its heat energy.

The 0.5 inch diameter insulated tube 36 is 0.5 inch in diameter and extends as a thermally insulated flue from the outlet at the highest point of the dome. This lets the 87 degree fluid keep on rising into the upper aluminum box 12 mounted 1.0 inch above the lower box 14. The 0.5 inch insulated tube stops and is open at the bottom of the upper box 12.

The concept is that the LED light source 30 will heat the aluminum sheet of the bottom 22 of the lower box 14. The heat will move through the sheet and transfer the heat energy into the liquid in the domed chamber 32. Convection then draws through the intakes, possibly as laminar flow, and drives the cycle, expelling warm cooling liquid at the top and drawing in cool cooling liquid at the bottom through the inlets 42. The boxes 12, 14 can be round cylinders, square, as in the preferred embodiment, or disc shaped. Any construction or shape may be used as long as the boxes 12, 14 hold enough water or other cooling liquid, considering the efficiency of the liquid to air heat exchanger, to keep the streetlight cool.

The two box concept with tubes connecting them in a way to promote flow through the boxes 12, 14 keeps the heated water in the upper box 12 removing most of the heat energy there. The lower box 14 removes the remaining heat. As more heat is created by bigger or more lights there could be three, four, or more boxes attached with the fluid going from the lower box 14, were the light is mounted, to the upper box 12. The flue 36 is insulated in the same manner as the dome 34 so as not to transfer heat to the boxes 12, 14 the tube is moving through.

Thus, an improved passive cooling system is disclosed. While embodiments and applications of this invention have been shown and described, it would be apparent to those skilled in the art that many more modifications are possible without departing from the inventive concepts herein.

What is claimed is:

1. A streetlight comprising
a light-emitting diode;
a passive cooling system including an upper cooling chamber, a lower cooling chamber displaced from the upper cooling chamber, a domed chamber and a return passage, the lower cooling chamber having a bottom of heat conducting material, the light-emitting diode being outside the lower cooling chamber and in thermal engagement with the bottom, the domed chamber being inside the lower cooling chamber in thermal engagement with the bottom directly over the light-emitting diode and having inlet channels in thermal engagement with the bottom and an outlet to the upper cooling chamber, the return passage being in open communication with the upper chamber and the lower chamber.

2. The streetlight of claim 1, the return passage being displaced from the outlet to the upper cooling chamber.

3. The streetlight of claim 1, the domed chamber being defined by a truncated conical dome and a tube with a central passageway extending from the truncation, the truncated conical dome and the tube being insulated.

4. The streetlight of claim 1, the passive cooling system further including at least one cooling chamber between the upper cooling chamber and the lower cooling chamber, the return passage in open communication with the upper chamber and the lower chamber being circuitous between all cooling chambers and open within the at least one cooling chamber between the upper cooling chamber and the lower cooling chamber.

\* \* \* \* \*